United States Patent [19]

Tamagawa et al.

[11] Patent Number: 4,865,941

[45] Date of Patent: Sep. 12, 1989

[54] IMAGE-FORMING METHOD EMPLOYING LIGHT-SENSITIVE MATERIAL HAVING A SPECIFIED PAPER SUPPORT

[75] Inventors: Shigehisa Tamagawa, Shizuoka; Masayuki Kuroishi, Kanagawa, both of Japan

[73] Assignee: Fuji Photo Film Co., Ltd., Kanagawa, Japan

[21] Appl. No.: 307,237

[22] Filed: Feb. 6, 1989

Related U.S. Application Data

[62] Division of Ser. No. 101,460, Sep. 28, 1987, abandoned.

[30] Foreign Application Priority Data

Sep. 26, 1986 [JP] Japan .................................. 61-227766
Sep. 26, 1986 [JP] Japan .................................. 61-227767

[51] Int. Cl.$^4$ ........................... G03C 5/54; G03C 1/72
[52] U.S. Cl. ....................................... 430/138; 430/203; 430/212; 430/213; 430/253; 430/254; 430/538
[58] Field of Search ............... 430/203, 213, 212, 254, 430/939, 270, 281, 538, 138, 253

[56] References Cited

U.S. PATENT DOCUMENTS

| | | | |
|---|---|---|---|
| 4,060,507 | 11/1977 | Floyd et al. | 528/245 |
| 4,064,304 | 12/1977 | Fujita et al. | 427/389.9 |
| 4,308,542 | 12/1981 | Maekawa et al. | 427/288 |
| 4,446,174 | 5/1984 | Maekawa et al. | 428/211 |
| 4,482,628 | 11/1984 | Katsura et al. | 430/538 |
| 4,624,910 | 11/1986 | Takeda | 430/203 |
| 4,629,676 | 12/1986 | Hayakawa et al. | 430/203 |
| 4,649,098 | 3/1987 | Takeda | 430/270 |

Primary Examiner—Paul R. Michl
Assistant Examiner—Patrick A. Doody
Attorney, Agent, or Firm—Sughrue, Mion, Zinn, Macpeak & Seas

[57] ABSTRACT

A light-sensitive material comprising a light-sensitive layer containing silver halide, a reducing agent and a polymerizable compound provided on a paper support. The paper support has a low shrinkage ratio of not more than 0.15% both in the machine direction and in the cross direction. The shrinkage ratio is a value measured at the change of relative humidity from 75% to 60%.

12 Claims, No Drawings

IMAGE-FORMING METHOD EMPLOYING LIGHT-SENSITIVE MATERIAL HAVING A SPECIFIED PAPER SUPPORT

This is a divisional of 101,460 filed 9/28/87, now abandoned.

BACKGROUND OF THE INVENTION

1. Field of the invention

This invention relates to a light-sensitive material comprising a light-sensitive layer containing silver halide, a reducing agent and a polymerizable compound provided on a support.

2. Description of prior art

Light-sensitive materials comprising a light-sensitive layer containing silver halide, a reducing agent and a polymerizable compound provided on a support can be used in an image forming method in which a latent image of silver halide is formed, and then the polymerizable compound is polymerized to form the corresponding image.

Examples of said image forming methods are described in Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore the process takes a relatively long time for the operation.

An improved image forming method employing a dry process is described in Japanese Patent Provisional Publication Nos. 61(1986)-69062 and 61(1986)-73145 (the contents of both publications are described in U.S. Pat. No. 4,629,676 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to form a polymer within the area where the latent image of the silver halide has been formed. The above method employing the dry process and the light-sensitive material employable for such method are also described in Japanese Patent Provisional Publication Nos. 61(1986)-183640, 61(1986)-188535 and 61(1986)-228441.

The above-mentioned image forming methods are based on the principle in which the polymerizable compound is polymerized within the area where a latent image of the silver halide has been formed.

Japanese Patent Provisional Publication No. 61(1986)-260241 describes another image forming method in which the polymerizable compound within the area where a latent image of the silver halide has not been formed is polymerized. In this method, when the material is heated, the reducing agent functions as polymerization inhibitor within the area where a latent image of the silver halide has been formed, and the polymerizable compound within the other area is polymerized.

As the support for the light-sensitive material, a paper is sometimes employed, because a paper is disposable, lightweight and easy to handle.

SUMMARY OF THE INVENTION

According to study of the present inventors, a paper support sometimes shows certain unfavorable behavior in the image forming method. In more detail, when an image is obtained from a light-sensitive material employing a paper support, a distortion of the image has been sometimes observed. The distortion further causes an irregular density within the area where an image should be formed uniformly with respect to the density.

The present inventors have studied on the abovementioned behavior of a paper support and discovered that a cause of the distortion is attributed to a shrinkage of the paper support of the light-sensitive material by the change of moisture (relative humidity). In the image-forming method, the development is performed using a developing solution (wet development) or by heating the material (heat development). Therefore, a paper support is inevitably affected by the change of relative humidity of the surrounding atmosphere in the course of a development process, whether the wet development or the heat development is employed. The shrinkage of the paper support in the development process directly causes distortion of the obtained image, because the development is performed simultaneously with or after an image exposure.

An object of the present invention is to provide a light-sensitive material employing a paper support which is minimized or reduced in the occurrence of the distortion of the image.

There is provided by the present invention a light-sensitive material comprising a light-sensitive layer containing silver halide, a reducing agent and a polymerizable compound provided on a paper support, characterized in that the paper support has a specifically low shrinkage ratio. The shrinkage ratio should be not more than 0.15% ($1.5 \times 10^{-3}$) of both in the machine direction (M.D.) and in the cross direction (C.D.). The value is measured at change of relative humidity from 75% to 60%, which is defined in J. TAPPI (Japan Technical Association of the Pulp and Paper Industry) No. 28-m.

In the light-sensitive material of the invention, the shrinkage ratio of the paper support is so low at change of moisture in the surrounding conditions that the shrinkage of the support can be greatly reduced in the course of the development process (both a wet development and a heat development). Therefore, the light-sensitive material of the invention gives an improved clear image in which the occurrence of the distortion in the image is greatly minimized or reduced.

DETAILED DESCRIPTION OF THE INVENTION

The light-sensitive material of the present invention utilizes a paper support. The term "paper support" in the invention refers to a base paper essentially composed of wood pulp (hereinafter referred to as "base paper") or to a sheet comprising a coating layer provided on the base paper.

The paper support used in the light-sensitive material of the invention has a low shrinkage ratio of not more than 0.15 % ($1.5 \times 10^{-3}$) both in the machine direction (M.D.) and in the cross direction (C.D.) at the change of relative humidity from 75% to 60%. The shrinkage ratio more preferably is not more than 0.10% ($1.0 \times 10^{-3}$) both in the M.D. and in the C.D. Generally, it is possible that only the shrinkage ratio in C.D. is defined above, because a shrinkage ratio in C.D. is usually higher than that in M.D.

The proportion of the shrinkage ratio in C.D. to that in M.D. (C.D./M.D.) preferably is not more than 3.0, and more preferably is not more than 2.0. When the proportion of the shrinkage ratio in C.D. to that in M.D. is more than 3.0, the distortion of the image may increase.

The shrinkage ratio is measured at the change of relative humidity from 75 % to 60 % according to the following manner. Test paper is cut into pieces having a width of 50 mm and a length of from 140 to 640 mm with respect to the machine direction or the cross direction. The test piece is stretched at a tensile forth as much as half of the basis weight of the test piece per the width of 50 mm. Then, the shrinkage ratio is measured while the environmental relative humidity is changed from 75% to 60%. Testing method and apparatus of measurement for the shrinkage of paper are described in more detail in Specification of J. Tappi No. 28-m (1972).

The constitution of the paper support used in the present invention and means of decreasing the shrinkage ratio are described below.

The base paper used for the paper support is mainly composed of wood pulp. As the wood pulp, any of softwood pulp and hardwood pulp can be used. However, hardwood pulp is preferred, because it is mainly composed of short fibers, which are convenient for increasing the smoothness of the paper. In more detail, hardwood pulp is preferably used in an amount of not less than 60 weight % based on the total amount of pulp contained in the base paper.

The wood pulp can be partially replaced with a synthetic pulp composed of polyethylene, polypropylene or the like, or a synthetic fiber composed of a polyester, polyvinyl alcohol, nylon or the like.

The Canadian standard freeness (CSF) of wood pulp as a whole preferably ranges from 250 to 500 cc, and more preferably ranges from 300 to 450 cc. After having been beaten, the pulp preferably has such a distribution of fiber length that an amount of residual pulp on 24 mesh screen and on 42 mesh screen is not more than 40 weight % based on the total amount of pulp. The method for the determination of the fiber length distribution is defined in JIS-P-8207.

A melamine resin is preferably added to the base paper to decrease the shrinkage ratio. Examples of the melamine resin are a melamine-formaldehyde resin and a trimethylolmelamine resin. The base paper preferably contains the melamine resin in an amount of from 0.5 to 1.5 weight %.

A filler is preferably added to the base paper to increase the smoothness and/or to decrease the shrinkage ratio. Examples of the filler include calcium carbonate, talc, clay, kaolin, titanium dioxide and fine particles of urea resin. Among them, talc and clay are preferred. In order to decrease the shrinkage ratio, the base paper preferably contains the filler in an amount of not less than 5 weight %, and more preferably not less than 10 weight %.

An internal size (e.g., rosin, parafin wax, a salt of higher fatty acid, a salt of an alkenylsuccinic acid, a fatty acid anhydride or an alkylketene dimer), a paper strengthening agent (e.g., polyacrylamide, starch, polyvinyl alcohol), a softening agent (e.g., a reaction product of a maleic anhydride copolymer with a polyalkylene polyamine, a quarternary ammonium salt of a higher fatty acid), a fixing agent (e.g., aluminium sulfate, polyamide-polyamine-epichlorohydrin), a colored dye and/or a fluorescent dye can be added to the base paper in addition to the melamine resin and the filler.

The base paper can be prepared from the above-mentioned paper stuff using Fourdrinier paper machine or Cylinder paper machine.

The J/W ratio (ratio of paper jet to wire speed) in the paper machine is preferably 0.9 to 1.1, more preferably 0.95 to 1.05.

The base paper preferably has a basis weight of 20 to 200 g/m$^2$, and more preferably 30 to 100 g/m$^2$. The thickness of the base paper preferably ranges from 25 to 250 $\mu$m, and more preferably from 40 to 150 $\mu$m.

The base paper can be passed through a calender such as on-machine calender in a paper machine or supercalender outside a paper machine to improve the smoothness. After having been calendered, the density (bulk density) of the base paper preferably ranges from 0.7 to 1.2 g/m$^2$, and more preferably from 0.85 to 1.10 g/m$^2$, wherein the value is measured according to JIS-P-8118.

The shrinkage of the base paper can be reduced to a level of not more than 0.15% both in M.D. and in C.D. by various means in the course of the above-stated process such as by adjusting the Canadian standard freeness of pulp in the paper stuff, by adding a melamine resin, by adding a relatively large amount of filler or by adjusting a paper machine (e.g., J/W ratio of machine).

The base paper itself can be used as a paper support of the light-sensitive material of the invention. Alternatively, a surface size can be coated on the base paper. The shrinkage ratio can be reduced by coating a surface size on the base paper. In order to reduce the shrinkage ratio, the surface size preferably is a glyoxal resin, an ethyleneurea resin, a denaturated polyacrylamide or a polyaldehyde resin. The surface size is preferably coated on the base paper in a coating amount of from 0.1 to 10 g/m$^2$.

In addition to the above-mentioned surface size, other conventional surface size can be coated on the base paper. In the case that the shrinkage ratio of the base paper itself is sufficiently decreased, there is no specific limitation with respect to the surface size to be used. Examples of the other surface size include polyvinyl alcohol, starch, polyacrylamide, gelatin, casein, styrene-maleic anhydride copolymer, alkylketene dimer, polyurethane, an epoxidized fatty acid amide.

A coating layer can be provided on the base paper (including that coated with a surface size). There is no specific limitation with respect to composition of the coating layer.

A hydrophobic polymer can be contained in the coating layer to reduce water absorptiveness of the paper support. The water absorption of the paper support from a coating solution of a light-sensitive layer causes a distortion or deformation of the light-sensitive material. Therefore, it is preferable that the surface of the paper support on which the light-sensitive layer is provided has a low water absorptiveness of not more than 3 g/m², which is a value measured according to Cobb test method.

The polymer can be a homopolymer or a copolymer. The copolymer may partially contain a hydrophilic repeating unit, so long as it is hydrophobic as a whole. Examples of the hydrophobic polymers include vinylidene chloride, styrene-butadiene copolymer, methyl methacrylatebutadiene copolymer, acrylonitrile-butadiene copolymer, styrene-acrylate copolymer, methyl methacrylate-acrylate copolymer and styrene-methacrylate-acrylate copolymer.

The hydrophobic polymer preferably has a cross-linked structure. The cross-lined structure can be introduced into the hydrophobic polymer when a conventional hardening agent (crosslinking agent) is used together with the hydrophobic polymer in the course of the preparation of the paper support. Examples of the hardening agent include an active vinyl compound (e.g., 1,3-bis(vinylsulfonyl)-2-propanol, methylenebismaleimide), an active halogen compound (e.g., sodium salt of 2,4-dichloro-6-hydroxy-S-triazine, 2,4-dichloro-6-hydroxy-S-triazine, N,N'-bis(2-chloroethylcarbamyl)-piperazine), an epoxy compound (e.g., bis(2,3-epoxypropyl)methylpropylammonium p-toluenesulfonate), and a methanesulfonate compound (e.g., 1,2-di(methane-sulfonoxy)ethane).

A pigment can be added to the coating layer to increase the smoothness of the surface of the coating layer and to facilitate the formation of the coating layer in the course of the preparation. The pigment may by any of pigments employed in a conventional coated paper (coat paper, art paper, baryta paper etc.). Examples of the inorganic pigments include titanium dioxide, barium sulfate, talc, clay, kaolin, calcined kaolin, aluminum hydroxide, amorphous silica and crystalline silica. Examples of the organic pigments include polystyrene resin, acrylic resin, urea-formaldehyde resin.

A waterproofing agent can be also added to the coating layer. Examples of the waterproofing agents include polyamidepolyamine-epichlorohydrin resin, polyamidepolyurea resin, glyoxal resin, etc. Among them, resins containing no formaldehyde (e.g., polyamide-polyamineepichlorohydrin resin and polyamide-polyurea resin) are particularly preferred.

The coating layer can be prepared by coating a solution on the surface of the base paper. A latex in which the components such as the hydrophobic polymer, hardening agent, pigment and/or waterproofing agent are dissolved, dispersed or emulsified can be used as the coating solution. The coating solution can be coated on the base paper according to any of the conventional coating methods such as dip coating method, air-knife coating method, curtain coating method, roller coating method, doctor coating method, gravure coating method, etc.

The coating layer is preferably provided on the base paper in a coating amount 1 to 30 g/m², and more preferably 5 to 20 g/m².

The paper support can be passed through a calender such as gloss calender or supercalender to improve the smoothness of the paper support simultaneously with or after coating the layer on the base paper.

The silver halide, the reducing agent, the polymerizable compound which constitute the light-sensitive layer provided on the support are described below. Thus composed material is referred hereinafter to as "light-sensitive material".

There is no specific limitation with respect to silver halide contained in the light-sensitive layer. Examples of the silver halides include silver chloride, silver bromide, silver iodide, silver chlorobromide, silver chloroiodide, silver iodobromide, and silver chloroiodobromide in the form of grains.

The halogen composition of individual grains may be homogeneous or heterogeneous. A silver halide grain can have a core/shell structure in which the silver iodide content in the shell is higher than that in the core. There is no specific limitation on the crystal habit of silver halide grains. For example, a tubular grain having an aspect ratio of not less than 3 can be used.

Two or more kinds of silver halide grains which differ in halogen composition, crystal habit, grain size, and/or other features from each other can be used in combination. There is also no specific limitation on grain size distribution of silver halide grains. For example, the silver halide grains having such a grain size distribution that the coefficient of the variation is not more than 20% can be employed.

The silver halide grains ordinarily have a mean size of 0.001 to 5 μm, more preferably 0.001 to 2 μm.

The total silver content (including silver halide and an organic silver salt which is one of optional components) in the light-sensitive layer preferably is in the range of from 0.1 mg/m² to 10 g/m². The silver content of the silver halide in the light-sensitive layer preferably is not more than 0.1 g/m², more preferably in the range of from 1 mg to 90 mg/m².

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

The light-sensitive materials employing the reducing agent having these functions (including compounds referred to as developing agent, hydrazine derivative or precursor of reducing agent) are described in Japanese Patent Provisional Publication Nos. 61(1986)-183640, 61(1986)-188535 and 61(1986)-228441. These reducing agents are also described in T. James, "The Theory of the Photographic Process", 4th edition, pp. 291-334 (1977), Research Disclosure No. 17029, pp. 9-15 (June 1978), and Research Disclosure No. 17643, pp. 22-31 (December 1978). The reducing agents described in the these publications can be employed in the light-sensitive material of the present invention. Thus, "the reducing agent(s)" in the present specification means to include all of the reducing agents described in the above mentioned publications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, and any known polymerizable compounds including monomers, oligomers and polymers can be contained in the light-sensitive layer. In the case that heat development (i.e., thermal development) is utilized for developing the light-sensitive material, the polymerizable compounds having a relatively higher boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

Preferred polymerizable compounds employable for the light-sensitive material are compounds which are polymerizable through addition reaction or ring-opening reaction. Preferred examples of the compounds being polymerizable through addition reaction include compounds having an ethylenic unsaturated group. Preferred examples of the compounds being polymerizable through ringopening reaction include the compounds having and epoxy group. Among them, the compounds having an ethylenic unsaturated group are preferred.

The polymerizable compound employable for the light-sensitive material are described in the above-mentioned and later-mentioned publications concerning the light-sensitive material.

The polymerizable compounds can be used singly or in combination of two or more compounds. For example, a mixture of two or more polymerizable compounds can be employed. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

Various embodiments of the light-sensitive materials, optional components which may be contained in the light-sensitive layer, and auxiliary layers which may be optionally arranged on the light-sensitive materials are described below.

The polymerizable compound is preferably dispersed in the form of oil droplets in the light-sensitive layer. Other components in the light-sensitive layer, such as silver halide, the reducing agent, the color image forming substances may be also contained in the oil droplets.

In the case that silver halide grains are contained in the oil droplets, the oil droplets containing five or more silver halide grains are preferably more than 50 % by weight.

The oil droplets of the polymerizable compound are preferably prepared in the form of microcapsules. There is no specific limitation on preparation of the microcapsules.

There is also no specific limitation on shell material of the microcapsule, and various known materials such as polymers which are employed in the conventional microcapsules can be employed as the shell material. Examples of the shell material include polyamide resin and/or polyester resin, polyurea resin and/or polyurethane resin, aminoaldehide resin, gelatin, epoxy resin, a complex resin containing polyamide resin and polyurea resin, a complex resin containing polyurethane resin and polyester resin.

The mean size of the microcapsule preferably ranges from 0.5 to 50 $\mu$m, more preferably 1 to 25 $\mu$m, most preferably 3 to 20 $\mu$m.

In the case that silver halide grains are contained in the microcapsule, the silver halide grains are preferably arranged in the shell material of the microcapsules.

Further, two or more kinds of the microcapsules differing from each other with respect to at least one of the silver halide, the polymerizable compound and the color image forming substance can be employed. Furthermore, three or more kinds of the microcapsules differing from each other with respect to the color image forming substance is preferably employed to form a full color image.

The light-sensitive layer can further contain optional components such as color image forming substances, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers, binders, photo polymerization initiator and solvent of the polymerizable compound.

There is no specific limitation with respect to the color image forming substance, and various kinds of substances can be employed. Thus, examples of the color image forming substance include both colored substance (i.e., dyes and pigments) and non-colored or almost noncolored substance (i.e., color former or dye- or pigmentprecursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145 (corresponding to U.S. Pat. No.

4,629,676 and European Patent Provisional Publication No. 0174634A2).

Examples of the dyes and pigments (i.e., colored substances) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acidbase reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), pp. 29-58 (pressure-sensitive copying paper), pp. 87-95 (azo-graphy), pp. 118-120 (heat-sensitive color formation by a chemical change) or in MSS. of the seminer promoted by the Society of Kinki Chemical Industry, "The Newest Chemistry of Coloring Matter—Attractive Application and New Development as a Functional Coloring Matter", pp. 26-32 (June 19, 1980).

In the case that the color image forming substance comprising two components (e.g., a color former and a developer), one component and the polymerizable compound is contained in the microcapsule, and the other component is arranged outside of the microcapsule in the light-sensitive layer, a color image can be formed on the light-sensitive layer.

The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide. The sensitizing dye is preferably added during the stage of the preparation of the silver halide emulsion (simultaneously with or after the grain formation).

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an $\alpha$-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inorganic silver salt can be added to the light-sensitive layer to obtain the same effect.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inorganic bases, organic bases, base precursors, oils, surface active agents, compounds functioning as an antifogging agent and/or a development accelerator, hot-melt solvents, antioxidants and the like. These groups, however, generally have certain combined functions, i.e., two or more of the above-mentioned effects. Thus, the above classification is for the sake of convenience, and one compound often has a plurality of functions combined.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckman rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

In the light-sensitive material, the silver halide, the reducing agent and the polymerizable compound are preferably contained in a microcapsule and the base or base precursor is preferably arranged outside of the microcapsule in the light-sensitive layer. Further, the base or base precursor can be contained in a different microcapsule from that containing the polymerizable compound. The base or base precursor can be contained in the microcapsule under condition that the base or base precursor is dissolved or dispersed in an aqueous solution of a water retention agent, or under condition that the base or base precursor is adsorbed on solid particles. Furthermore, the base or base precursor can be contained in a layer different from the light-sensitive layer.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a high maximum density and a low minimum density (an image having high contrast). Examples of the compounds include a 5- or 6-membered nitrogen containing heterocyclic compound (e.g., a cyclic amide compound), a thiourea derivative, a thioether compound, a polyethylene glycol derivative, a thiol derivative, an acetylene compound and a sulfonamide derivative.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having -$SO_2$- and/or -CO- group described in U.S. Pat. No. 3,347,675; polar compounds described in U.S. Pat. No. 3,667,959; and 1,10-decanediol, methyl anisate and biphenyl suberate described in Research Disclosure 26-28 (December 1976). The light-sensitive material employing the hot-melt solvents is described in Japanese Patent Application No. 60(1985)-227527. The hot-melt solvent is preferably used in an amount of from 0.5 to 50 % by weight, and more preferably from 1 to 20 % by weight, based on the total solid content of the light-sensitive layer.

The antioxidants can be used to eliminate the influence of the oxygen which has an effect of inhibiting polymerization in the development process. Example of the antioxidants is a compound having two or more mercapto groups.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", pp. 6–18 edited by the Editorial Committee of High Polymer Experimental Study of the High Polymer Institute, published by Kyoritsu Shuppan (1983). The thermal polymerization initiators are preferably used in the amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development.

The antismudging agents employable in the light-sensitive material preferably are particles which are solid at ambient temperatures. Such particles preferably have a mean size of 3 to 50 μm, more preferably 5 to 40 μm. When the microcapsule is employed in the light-sensitive material, the size of said particle is preferably larger than that of the microcapsule.

Binders employable in the light-sensitive material preferably are transparent or semi-transparent hydrophilic binders. The light-sensitive material employing a binder is described in Japanese Patent Provisional Publication No. 61(1986)-69062 (corresponding to U.S. Pat. No. 4,629,676 and European Patent Provisional Publication No. 0174634A2).

The photo polymerization initiator can be contained in the light-sensitive layer to polymerize the unpolymerized polymerizable compound after the image-formation.

In the case that the solvent of the polymerizable compound is used, the solvent is preferably contained in a microcapsule which is different from the microcapsule containing the polymerizable compound.

Examples and usage of the other optional components which can be contained in the light-sensitive layer are also described in the above-mentioned publications and applications concerning the light-sensitive material, and in Research Disclosure Vol. 170, No. 17029, 9–15 (June 1978).

Examples of auxiliary layers which are optionally arranged on the light-sensitive materials include an image-receiving layer, a heating layer, an antistatic layer, an anticurl layer, a release layer, a cover sheet or a protective layer, a layer containing a base or base precursor and a base barrier layer.

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving material.

The light-sensitive material can be prepared, for instance, by the following process.

The light-sensitive material is usually prepared by dissolving, emulsifying or dispersing each of the components of the light-sensitive layer in an adequate medium to obtain a coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be used.

In the preparation of the silver halide emulsions, hydrophilic colloids (e.g., gelatin) are advantageously used as protective colloids to improve the sensitivity of the light-sensitive material. In the formation of silver halide grains in the silver halide emulsion, ammonia, an organic thioether derivative or sulfur-containing compound can be used as a silver halide solvent. Further, in the grain formation or physical ripening, a cadmium salt, a zinc salt, a lead salt, a thallium salt, or the like can be introduced into the reaction system. Furthermore, for the purpose of overcoming high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

Where the sensitizing dyes are added to the silver halide emulsion, the sensitizing dye is preferably added during the preparation of the emulsion. Where the 5- or 6- membered nitrogen containing heterocyclic compounds are added to the silver halide emulsion as an antifogging agent and/or a development accelerator, the compounds are preferably added during the grain formation or the ripening of the emulsion.

Where the organic silver salts are introduced in the light-sensitive microcapsule, the emulsion of the organic silver salts can be prepared in the same manner as in the preparation of the silver halide emulsion.

In preparation of the light-sensitive material, the polymerizable compounds are used as the medium for preparation of the liquid composition containing another component of the light-sensitive layer. For example, the silver halide, including the silver halide emulsion), the reducing agent, or the color image forming substance can be dissolved, emulsified or dispersed in the polymerizable compound to prepare the light-sensitive material. Especially, the color image forming substance is preferably incorporated in the polymerizable compound. Further, the necessary components for preparation of a microcapsule such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The light-sensitive composition can be also prepared by dispersing microcapsule containing silver halide emulsion as a core structure in the polymerizable compound instead of employing the above polymer.

The polymerizable compound (including the light-sensitive composition) are preferably emulsified in an aqueous medium to prepare the coating solution. The necessary components for preparation of the microcapsule, such as shell material can be incorporated into the emulsion. Further, other components such as the reducing agent can be added to the emulsion.

The emulsion of the polymerizable compound can be processed for forming shell of the microcapsule. It is preferable, though not limitative, that the microcapsule is prepared by emulsifying core materials containing the polymerizable compound and forming a polymeric membrane (i.e., shell) over the core materials.

When the emulsion of the polymerizable compound (including the dispersion of the microcapsule) has been prepared by using the light-sensitive composition, the emulsion can be used as the coating solution of the light-sensitive material. The coating solution can be also prepared by mixing the emulsion of the polymerizable compound and the silver halide emulsion. The other components can be added to the coating solution in a similar manner as the emulsion of the polymerizable compound.

The light-sensitive material of the invention can be prepared by coating and drying the coating solution on a support in the conventional manner.

Use of the light-sensitive material is described below.

In the use of the light-sensitive material of the invention, a development process is conducted simultaneously with or after an imagewise exposure.

Various exposure means can be employed in the imagewise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either monochromatic image or color image.

Development of the light-sensitive material can be conducted simultaneously with or after the imagewise exposure. The development can be conducted using a developing solution in the same manner as the image forming method described in Japanese Patent Publication No. 45(1970)-11149 (corresponding to U.S. Pat. No. 3,697,275). The image forming method described in Japanese Patent Provisional Publication No. 61(1986)69062 (corresponding to U.S. Pat. No. 4,629,676 and European Patent Provisional Publication No. 0174634A2) which employs a heat development process has an advantage of simple procedures and short processing time because of the dry process. Thus, the latter method is preferred as the development process of the light-sensitive material.

Heating in the heat development process can be conducted in various known manners. The heating layer which is arranged on the light-sensitive material can be used as the heating means in the same manner as the light-sensitive material described in Japanese Patent Provisional Publication No. 61(1986)-294434. Further, the light-sensitive material can be heated while suppressing supply of oxygen into the light-sensitive layer from outside. The heating temperature for the development process usually ranges from 80° C. to 200° C., and preferably from 100° C. to 160° C. Various heating patterns are applicable. The heating time is usually not shorter than 1 second, and preferably from 1 second to 5 minutes, and more preferably from 1 second to 1 minute.

During the above development process, a polymerizable compound within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized.

In the above development process, a polymer image can be formed on the light-sensitive layer. A pigment image can be also obtained by fixing pigments to the polymer image.

Further, a color image can be formed on the light-sensitive material in which the light-sensitive layer contains a color former and a developer, one of them is together with the polymerizable compound contained in a microcapsule, and the other is arranged outside of the microcapsule.

The image can be also formed on the image-receiving material. The image-receiving material is described hereinbelow. The image forming method employing the image-receiving material or the image-receiving layer is described in Japanese Patent Provisional Publication No. 61(1986)-278849.

Examples of the material employable as the support of the image-receiving material include glass, paper, fine paper, coat paper, cast-coated paper, baryta paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene). In the case that a porous material, such as paper is employed as the support of the image-receiving material, the porous support preferably has such a surface characteristic that a filtered maximum waviness of not less than 4 $\mu$m is observed in not more than 20 positions among 100 positions which are determined at random on a filtered waviness curve obtained according to JIS-B-0610. Further, a transparent material can be used as the support of the image-receiving material to obtain a transparent or a projected image.

The image-receiving material is usually prepared by providing the image-receiving layer on the support. The image-receiving layer can be constructed according to the color formation system. In the cases that a polymer image is formed on the image-receiving material and that a dye or pigment is employed as the color image forming substance, the image-receiving material be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-recording layer can be composed of two or more layers containing two or more mordants different in the mordanting power from each other.

The image-receiving layer preferably contains a polymer as binder. The binder which may be employed in the above-mentioned light-receiving layer is also employable in the image-receiving layer. Further, a polymer having a transmission coefficient of oxygen of not more than $1.0 \times 10^{-11}$ cm$^3$.cm/cm$^2$.sec.cmHg can be used as the binder to protect the color of the image formed on the image-receiving material.

The image-receiving layer can contain a granulated thermoplastic compound to obtain a glossy image. Further, the image-receiving layer can contain a white pigment (e.g., titanium dioxide) to function as a white reflection layer. Furthermore, a photo polymerization initiator or a thermalpolymerization initiator can be contained in the image-receiving layer to polymerize the unpolymerized polymerizable compound.

The image-receiving layer can be composed of two or more layers according to the above-mentioned functions. The thickness of the image-receiving layer preferably ranges from 1 to 100 $\mu$m, more preferably from 1 to 20 $\mu$m.

A protective layer can be provided on the surface of the image-receiving layer.

After the development process, pressing the light-sensitive material on the the image-receiving material to transfer the unpolymerized polymerizable compound to the image-receiving material, a polymer image can be obtained in the image-receiving material. The process for pressing can be carried out in various known manners.

In the case that the light-sensitive layer contains a color image forming substance, the color image forming substance is fixed by polymerization of the polymerizable compound. Then, pressing the light-sensitive material on the image-receiving material to transfer the color image forming substance in unfixed portion, a color image can be produced on the image-receiving material.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

EXAMPLE 1

Preparation of paper support

In a disk refiner, 80 parts of laubholz bleached kraft pulp (LBKP) and 20 parts of nadelholz bleached kraft pulp (NBKP) were beated to obtain a pulp having a Canadian standard features of 380 cc. To the resulting pulp were added 1.5 parts of rosin, 2.0 parts of aluminium sulfate and 0.8 part of trimethylolmelamine resin to obtain a paper stuff, in which the part was a dry weight ratio to the pulp. A base paper having a basis weight of 40 g/m$^2$ and a thickness of 50 μm was prepared from the obtained paper stuff using a Fourdrinier paper machine.

The obtained base paper was per se used as a paper support (a).

The shrinkage ratio in C.D. of the paper support (a) was 0.13 % and that in M.D. was 0.07 %, which were measured according J. Tappi No. 28-m.

Preparation of silver halide emulsion

In 1,000 ml of water were dissolved 20 g of gelatin and 3 g of sodium chloride, and the resulting gelatin solution was kept at 75° C. To the gelatin solution, 600 ml of an aqueous solution containing 21 g of sodium chloride and 56 g of potassium bromide and 600 ml of an aqueous solution containing 0.59 mole of silver nitrate were added simultaneously at the same feed rate over a period of 40 minutes to obtain a silver chlorobromide emulsion having cubic grains, uniform grain size distribution, a mean grain size of 0.35 μm and a bromide content of 80 mole %.

The emulsion was washed for desalting and then subjected to chemical sensitization with 5 mg of sodium thiosulfate and 20 mg of 4-hydroxy-6-methyl-1,3,3a,7-tetrazaindene at 60° C. Yield of the emulsion was 600 g.

Preparation of silver benzotriazole emulsion

In 3,000 ml of water were dissolved 28 g of gelatin and 13.2 g of benzotriazole, and the solution was kept at 40° C. while stirring. To the solution was added 100 ml of an aqueous solution of 17 g of silver nitrate over 2 minutes. Excessive salts were sedimented and removed from the resulting emulsion by pH-adjustment. Thereafter, the emulsion was adjusted to pH 6.30 to obtain a silver benzotriazole emulsion. The yield of the emulsion was 400 g.

Preparation of light-sensitive composition

In 100 g of trimethylolpropane triacrylate were dissolved 0.40 g of the following copolymer, 6.00 g of Pargascript Red I-6-B (tradename of Ciba-Geigy) and 2 g of Emulex NP-8 (tradename of Nippon Emulsion Co., Ltd.).

(Copolymer)

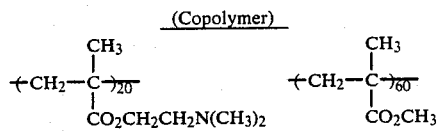

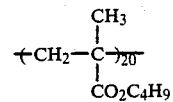

In 18.00 g of the solution was dissolved 0.002 g of the following thiol derivative.

(Thiol derivative)

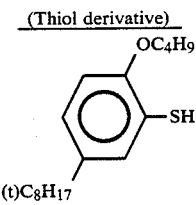

To the resulting solution was added a solution in which 0.16 g of the following reducing agent (I) and 1.22 g of the following reducing agent (II) are dissolved in 1.80 g of methylene chloride.

(Reducing agent (I))

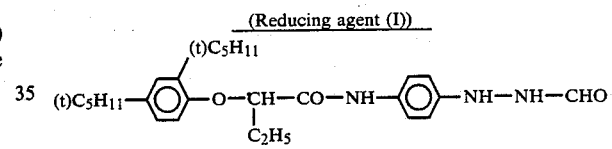

(Reducing agent (II))

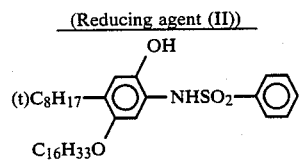

To the resulting solution were added 3.50 g of the silver halide emulsion and 3.35 g of the silver benzotriazole emulsion, and the mixture was stirred at 15,000 r.p.m. for 5 minutes to obtain a light-sensitive composition.

Preparation of light-sensitive microcapsule

To 10.51 g of 18.6 % aqueous solution of Isobam (tradename of Kuraray Co., Ltd.) was added 48.56 g of 2.89 % aqueous solution of pectin. After the solution was adjusted to a pH of 4.0 using 10% sulfuric acid, the light-sensitive composition was added to the resulting solution, and the mixture was stirred at 7,000 r.p.m. for 2 minutes to emulsify the light-sensitive composition in the aqueous medium.

To 72.5 g of the aqueous emulsion were added 8.32 g of 40% aqueous solution of urea, 2.82 g of 11.3% aqueous solution of resorcinol, 8.56 g of 37% aqueous solution of formaldehyde and 3.00 g of 8.00% aqueous solution of ammonium sulfate in this order, and the mixture was heated at 60° C. for 2 hours while stirring. After the mixture was adjusted to a pH of 7.3 using 10% aqueous solution of sodium hydroxide, 3.62 g of 30.9% aqueous solution of sodium hydrogen sulfite was added to the mixture to obtain a dispersion containing light-sensitive microcapsules.

Preparation of light-sensitive material

To 10.0 g of the light-sensitive microcapsule dispersion were added 1.0 g of 1% aqueous solution of the following anionic surfactant and 1.0 g of 10% solution (solvent: water/ethanol=50/50 as volume ratio) of guanidine trichroloacetate to prepare a coating solution.

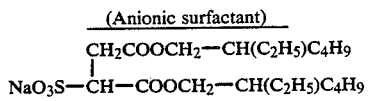
(Anionic surfactant)

The coating solution was uniformly coated on the surface of the paper support (a) using a coating rod of #40 to give a layer having a wet thickness of 70 μm and dried at about 40° C. to obtain a light-sensitive material (A).

EXAMPLE 2

Preparation of paper support

On the surface of the paper support (a) used in Example 1 was coated a glyoxal resin (BECKAMINE LH; produced by Dainippon Ink & Chemicals Inc.) as a surface size, to give a layer having an amount of 1.0 g/m² as a dry solid amount. Thus, a paper support (b) was obtained.

The shrinkage ratio in C.D. of the paper support (b) was 0.09% and that in M.D. was 0.04%.

Preparation of the light-sensitive material

The light-sensitive material (B) was prepared in the same manner as Example 1, except that the paper support (b) was used and the light-sensitive layer provided on the coating layer of the paper support (b).

EXAMPLE 3

Preparation of paper support

On the surface of the paper support (a) used in Example 1 was coated an ethyleneurea resin (Bekkamin E; produced by Dainippon Ink & Chemicals Inc.) as a surface size, to give a layer having an amount of 1.2 g/m² as a dry solid amount. Thus, a paper support (c) was obtained.

The shrinkage ratio in C.D. of the paper support (c) was 0.07% and that in M.D. was 0.03%.

Preparation of light-sensitive material

The light-sensitive material (C) was prepared in the same manner as in Example 1, except that the paper support (c) was used and the light-sensitive layer provided on the coating layer of the paper support (c).

COMPARISON EXAMPLE 1

Preparation of paper support

In a disk refiner, 70 parts of laubholz bleached kraft pulp (LBKP) and 30 parts of nadelholz bleached kraft pulp (NBKP) were beated to obtain a pulp having a Canadian standard freeness of 180 cc. To the resulting pulp were added 1.5 parts of rosin, 2.0 parts of aluminium sulfate and 1.0 part of cation starch to obtain a paper stuff, in which the part was a dry weight ratio to the pulp. A base paper having a basis weight of 40 g/m² and thickness of 50 μm was made from the obtained paper stuff in a Fourdrinier paper machine.

The obtained base paper was per se used as a paper support (x).

The shrinkage ratio in C.D. of the paper support (x) was 0.28% and that in M.D. was 0.11%.

Preparation of the light-sensitive material

The light-sensitive material (X) was prepared in the same manner as in Example 1, except that the paper support (x) was used.

COMPARISON EXAMPLE 2

Preparation of paper support

On the surface of the paper support (x) used in Comparison Example 1 was coated a starch as a surface size, to give a layer having an amount of 1.0 g/m² as a dry solid amount. Thus, a paper support (y) was obtained.

The shrinkage ratio in C.D. of the paper support (y) was 0.33% and that in M.D. was 0.16%.

Preparation of light-sensitive material

The light-sensitive material (Y) was prepared in the same manner as in Example 1, except that the paper support (y) was used and the light-sensitive layer provided on the coating layer of the paper support (y).

EXAMPLE 4

Preparation of light-sensitive material

The light-sensitive material (D) was prepared in the same manner as in Example 1, except that the silver benzotriazole emulsion was not added.

EXAMPLE 5

Preparation of light-sensitive material

The light-sensitive material (E) was prepared in the same manner as in Example 2, except that the silver benzotriazole emulsion was not added.

EXAMPLE 6

Preparation of light-sensitive material

The light-sensitive material (F) was prepared in the same manner as in Example 3, except that the silver benzotriazole emulsion was not added.

Preparation of image-receiving material

To 125 g of water was added 11 g of 40 % aqueous solution of sodium hexametaphosphate, and were further added 35 g of zinc 3,5-di-α-methylbenzylsalicylate and 82 g of 55% slurry of calcium carbonate, followed by coarsely dispersing in a mixer. The coarse dispersion was then finely dispersed in Dynomill dispersing device. To 200 g of the resulting dispersion were added 6 g of 50% latex of SBR (styrene-butadiene rubber) and 55 g of 8% aqueous solution of polyvinyl alcohol, and the resulting mixture was made uniform.

The mixture was then uniformly coated on a cast-coated paper to give a layer having a wet thickness of 30 μm and dried to obtain an image-receiving material.

Evaluation of light-sensitive material

Each of the light-sensitive materials prepared in Examples 1 to 6 and Comparison Examples 1 & 2 was exposed to light all over the light-sensitive layer using a tungsten lamp at 60 lux for 1 second, and then heated on a hot plate at 125° C. or 140° C. for 40 seconds. Each of the exposed and heated light-sensitive materials was then combined with the image-receiving material and passed through press rolls under pressure of 500 kg/cm² to obtain a magenta positive image on the image receiving material. The number of the spots of an irregular density on the obtained image was observed with the naked eye.

The results are set forth in Table 1. In Table 1, each of the value represents number of the spots of an irregular density having a diameter of 1 mm to 10 cm observed within a circular area of 10 cm².

TABLE 1

| Light-Sensitive Material | Paper Support | Shrinkage Ratio (%) | | Temperature of Heat Development | |
|---|---|---|---|---|---|
| | | C.D. | M.D. | 125° C. | 140° C. |
| (A) | (a) | 0.13 | 0.07 | ≦10 | ≦10 |
| (B) | (b) | 0.09 | 0.04 | ≦10 | ≦10 |
| (C) | (c) | 0.07 | 0.03 | ≦10 | ≦10 |
| (X) | (x) | 0.28 | 0.11 | 11–49 | ≧50 |
| (Y) | (y) | 0.33 | 0.16 | ≧50 | ≧50 |
| (D) | (a) | 0.13 | 0.07 | ≦10 | ≦10 |
| (E) | (b) | 0.09 | 0.04 | ≦10 | ≦10 |
| (F) | (c) | 0.07 | 0.03 | ≦10 | ≦10 |

It is apparent from the results in Table 1 that each of the light-sensitive materials (A), (B), (C), (D), (E) and (F) is remarkably reduced in the occurrence of the spots of an irregular density, which have been caused by a distortion of the image.

It is also apparent that the similar effects can be expected, whether the silver benzotriazole emulsion is used or not.

We claim:

1. An image-forming method which comprises the steps of:
   imagewise exposing to light a light-sensitive material comprising a light-sensitive layer containing silver halide, a reducing agent and an ethylenic unsaturated polymerizable compound provided on a paper support, wherein the paper support comprises a base paper coated with a surface size selected from the group consisting of a glyoxal resin, an ethyleneurea resin, a denatured polyacrylamide and a polyaldehyde resin, and the paper support has a low shrinkage ratio of not more than 0.15% both in its machine direction and in its cross direction to that in the machine direction being not more than 3.0, and said shrinkage ratio being a value measured at change of relative humidity from 75% to 60%; and
   simultaneously or thereafter heating the light-sensitive material to imagewise polymerize the polymerizable compound.

2. The image-forming method as claimed in claim 1, wherein after heating the light-sensitive material, the light-sensitive material is pressed on an image-receiving material to transfer the unpolymerized polymerizable compound to the image-receiving material.

3. The image-forming method as claimed in claim 1, wherein the light-sensitive material is heated at a temperature in the range of 80° to 200° C.

4. The image-forming method as claimed in claim 1, wherein the paper support has a shrinkage ratio of not more than 0.10% both in the machine direction and in the cross direction, said shrinkage being a value measured at the change of relative humidity from 75% to 60%.

5. The image-forming method as claimed in claim 1, wherein the paper support contains a melamine resin.

6. The image-forming method as claimed in claim 1, wherein the paper support contains a melamine resin in an amount of from 0.5 to 1.5 weight %.

7. The image-forming method as claimed in claim 1, wherein the paper support comprises a base paper coated with a surface size selected from the group consisting of a glyoxal resin, an ethyleneurea resin, a denaturated polyacrylamide and a polyaldehyde resin in a coating amount of from 0.1 to 10 g/m².

8. The image-forming method as claimed in claim 1, wherein the paper support contains pulp which has a Canadian standard freeness of 250 cc to 500 cc as a whole.

9. The image-forming method as claimed in claim 1, wherein the paper support contains a filler in an amount of not less than 5 weight %.

10. The image-forming method as claimed in claim 1, wherein the light-sensitive layer contains a color image forming substance.

11. The image-forming method as claimed in claim 1, wherein the silver halide and the polymerizable compound are contained in microcapsules which are dispersed in the light-sensitive layer.

12. The image-forming method as claimed in claim 1, wherein the light-sensitive layer contains an organic silver salt.

* * * * *

UNITED STATES PATENT AND TRADEMARK OFFICE
CERTIFICATE OF CORRECTION

PATENT NO. : 4,865,941

DATED : September 12, 1989

INVENTOR(S) : Shigehisa Tamagawa and Masayuki Kuroishi

It is certified that error appears in the above-identified patent and that said Letters Patent is hereby corrected as shown below:

ON THE TITLE PAGE
IN THE FOREIGN APPLICATION PRIORITY DATA

Delete "Sep. 26, 1986 [JP] Japan ......................61-227767".

Signed and Sealed this

Twenty-first Day of August, 1990

Attest:

HARRY F. MANBECK, JR.

*Attesting Officer*      *Commissioner of Patents and Trademarks*